United States Patent [19]
Tanaka et al.

[11] Patent Number: 5,307,362
[45] Date of Patent: Apr. 26, 1994

[54] MOLD-TYPE SEMICONDUCTOR LASER DEVICE

[75] Inventors: Haruo Tanaka; Naofumi Aoki, both of Kyoto, Japan

[73] Assignee: Rohm Co., Ltd., Kyoto, Japan

[21] Appl. No.: 970,468

[22] Filed: Nov. 2, 1992

[30] Foreign Application Priority Data

Nov. 6, 1991 [JP] Japan ................................. 3-290118
Nov. 6, 1991 [JP] Japan ................................. 3-290119

[51] Int. Cl.$^5$ ............................................. H01S 3/025
[52] U.S. Cl. ...................................... 372/50; 372/109; 385/92
[58] Field of Search ............................ 257/787–796; 372/36, 43, 44, 49, 50, 109; 385/88, 92–94

[56] References Cited

U.S. PATENT DOCUMENTS

| 5,068,866 | 11/1991 | Wada et al. | 372/49 X |
| 5,140,384 | 8/1992 | Tanaka | 257/790 X |
| 5,177,753 | 1/1993 | Tanaka | 372/50 X |

FOREIGN PATENT DOCUMENTS

64-28882  1/1989  Japan.

*Primary Examiner*—John D. Lee
*Attorney, Agent, or Firm*—William H. Eilberg

[57] ABSTRACT

A mold-type semiconductor laser device comprises a metallic support plate, a semiconductor laser chip carried by the support plate, a resinous molded body for sealing the laser chip; and a transparent plate attached to the molded body in opposed relation to a front cleavage face of the laser chip. The support plate has a positioning face which is substantially parallel to the front cleavage face of the laser chip and comes into direct contact with the transparent plate.

12 Claims, 7 Drawing Sheets

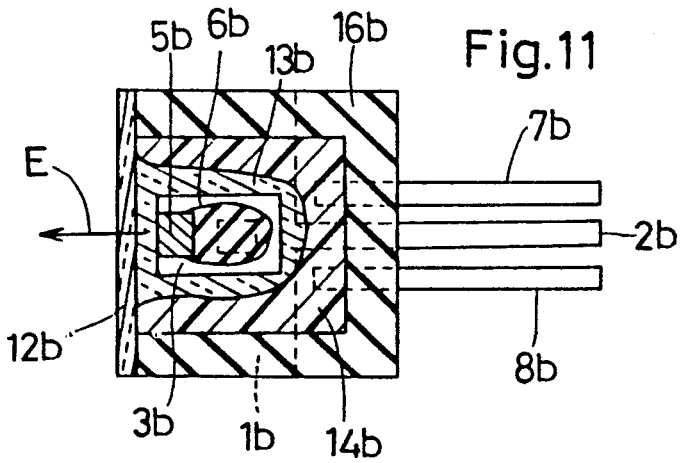
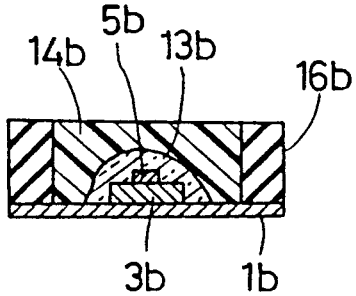
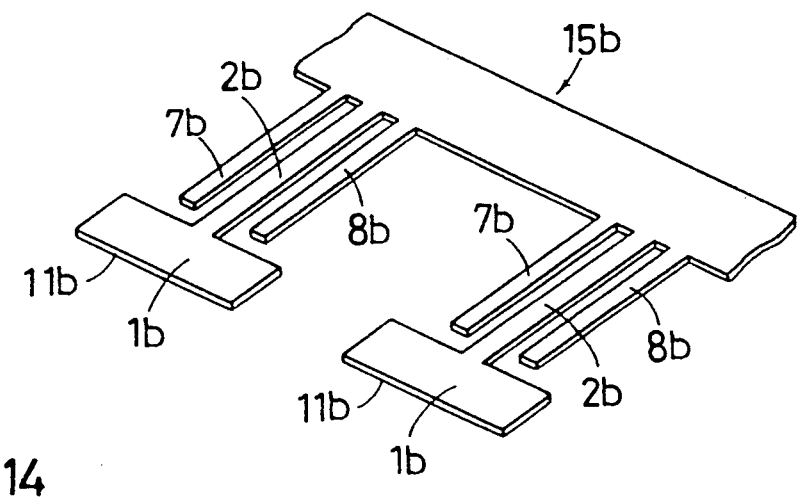
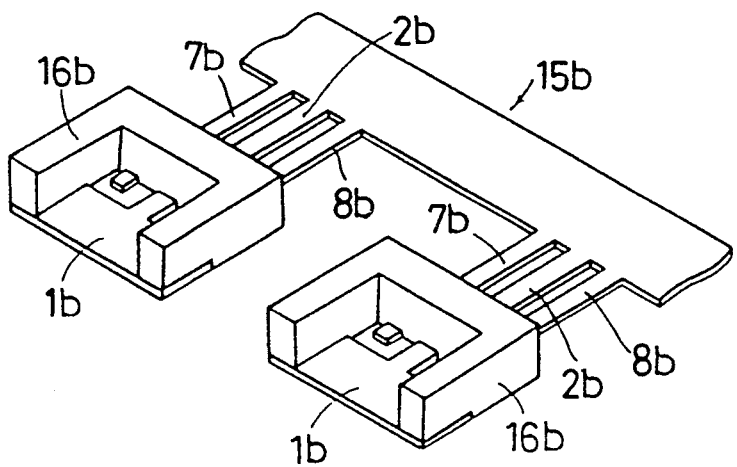

MOLD-TYPE SEMICONDUCTOR LASER DEVICE

BACKGROUND OF THE INVENTION

1. Field of the Invention

This invention relates generally to laser devices. More particularly, the present invention relates to a laser device of the type which utilizes a semiconductor laser chip sealed in a molded body.

2. Description of the Prior Art

A semiconductor laser chip used in a laser device is known to be adversely affected by humidity or other external factors. Therefore, it has been conventionally proposed to enclose the semiconductor laser chip in a resinous molded body for protection. This type of laser device is called "mold-type semiconductor laser device" and disclosed in Japanese Patent Application Laid-open No. 64-28882 for example.

For the convenience of explanation, reference is now made to FIGS. 23 and 24 which illustrate a prior art mold-type semiconductor laser device.

As shown in FIGS. 23 and 24, the prior art laser device comprises a metallic support plate 21 integral with a first lead 22. A mount 23 is attached on the support plate 21, and a semiconductor laser chip 24 is attached on the mount 23. The laser chip 24 has a front cleavage face 24' for emitting a coherent output laser beam E''.

The first lead 22 is flanked by second and third leads 25, 26, and the laser chip 24 together with the support plate 21 and the mount 23 is enclosed in a transparent resinous molded body 27 with the respective leads 22, 25, 26 projecting partially from the molded body 27. A glass plate 28 is attached to the molded body 27 in opposed relation to the front cleavage face 24' of the laser chip, so that the output laser beam E'' passes through the glass plate.

In such a laser device, it is known that the laser beam emission performance is influenced by the spacing L (see FIG. 24) between the glass plate 28 and the front cleavage face 24' of the laser chip 24. Further, the laser beam emission performance is also affected by the orientation of the glass plate 28 relative to the front cleavage face 24' of the laser chip 24. Thus, it is necessary to appropriately select the spacing L and orientation of the glass plate 28 in relation to the laser chip 24.

However, with the arrangement of the prior art laser device, the glass plate 28 is attached only to the molded body 27, so that the position and orientation of the glass plate 28 relative to the laser chip 24 is influenced by dimensional errors of the molded body 27. Thus, even if the laser chip 24 is accurately mounted on the support plate 21, the position and orientation of the glass plate 28 will be inappropriate when the molded body 27 is formed improperly, consequently resulting in deterioration of the laser beam emission performance.

SUMMARY OF THE INVENTION

It is, therefore, an object of the present invention to provide a mold-type semiconductor laser device wherein a transparent plate can be accurately positioned and oriented relative to a laser chip.

Another object of the present invention is to provide a mold-type semiconductor laser device wherein a laser chip together with its associated wires is reliably prevented from being damaged at the time of forming a resinous molded body.

According to the present invention, there is provided a mold-type semiconductor laser device comprising: a metallic support plate; a semiconductor laser chip carried by the support plate, the laser chip having a front cleavage face for emitting an output laser beam; a resinous molded body for sealing the laser chip; and a transparent plate attached to the molded body in opposed relation to the front cleavage face of the laser chip; wherein the support plate has a positioning face which is substantially parallel to the front cleavage face of the laser chip and comes into direct contact with the transparent plate.

With the arrangement described above, the positioning face of the support plate comes into direct contact with the transparent plate. Thus, if the front cleavage face of the laser chip is positioned and oriented accurately relative to the positioning face of the support plate, the transparent plate can be automatically adjusted in position and orientation relative to the front cleavage face of the laser chip. As a result, it is possible to improve the laser beam emission performance of the laser chip while also equalizing the product quality.

The support plate may be integrally formed with an upright mounting segment which has an opening in front of the front cleavage face of the laser chip. In this case, the positioning face is provided by the mounting segment.

Alternatively, the support plate may be integrally formed with a pair of upright side mounting projections forwardly on both sides of the front cleavage face of the laser chip, and the positioning face may be provided by each of the side mounting projections.

According to a preferred embodiment, the resinous molded body comprises a frame-like outer molded member surrounding the laser chip but spaced therefrom, and an inner molded member formed in the outer molded member for sealing the laser chip. In this case, the outer molded member may be formed by transfer molding, but the high pressure of such transfer molding does not adversely affect the laser chip and its associated wires because the outer molded member is spaced from the laser chip. The inner molded member, on the other hand, can be formed simply by pouring fluid resin in the outer molded member because the outer molded member can serve as a frame or mold required for molding the fluid resin.

Other objects, features and advantages of the present invention will be fully understood from the following detailed description given with reference to the accompanying drawings.

BRIEF DESCRIPTION OF THE DRAWINGS

In the accompanying drawings:

FIG. 11 is s sectional view taken along lines XI—XI in FIG. 10;

FIG. 12 is a sectional view taken along lines XII-—XII in FIG. 10;

FIGS. 13 through 16 are perspective views showing successive method steps for making the laser device illustrated in FIGS. 10 to 12;

DETAILED DESCRIPTION OF THE PREFERRED EMBODIMENTS

Figure 1:
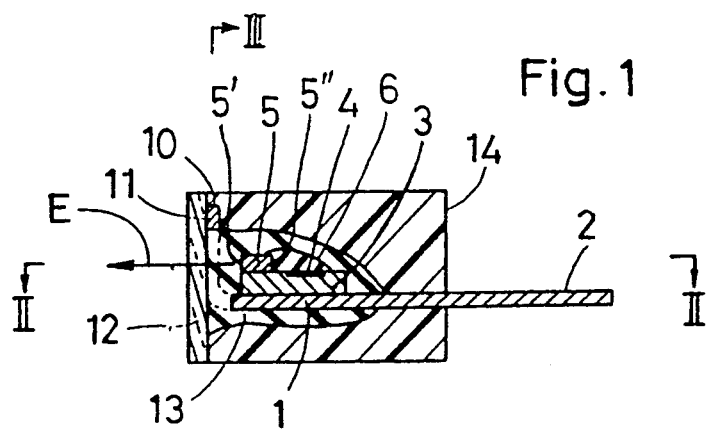
FIG. 1 is a sectional side view showing a mold-type semiconductor laser device according to a first embodiment of the present invention.

FIGS. 1 through 22 of the accompanying drawings show various embodiments of the present invention. Throughout these embodiments, like parts are designated by like reference numerals with or without alphabetical suffix such as 3, 3a, 3b for the convenience of illustration.

EMBODIMENT 1

Figure 2:
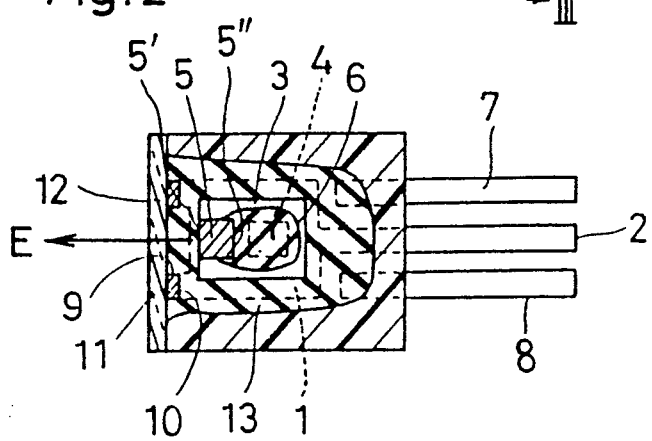
FIG. 2 is a sectional view taken along lines II—II in FIG. 1.
Figure 3:
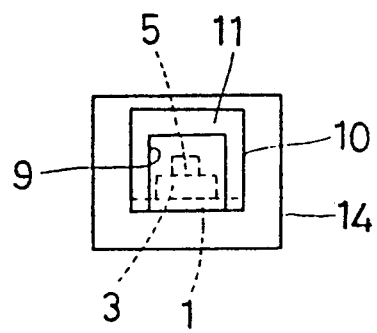
FIG. 3 is a front view of the same laser device.

Referring first to FIGS. 1-3 of the accompanying drawings, there is illustrated a mold-type semiconductor laser device according to a first embodiment of the present invention. The laser device comprises a thin metallic support plate 1 integral with a first lead 2. A mount 3, which itself is provided with a monitoring photodiode 4, is attached on the support plate 1.

A semiconductor laser chip 5 is attached on the mount 3. The orientation of the laser chip 5 is such that it emits an output laser beam E from its front cleavage face 5' in parallel to the support plate 1 while also emitting a monitor laser beam E' from its rear cleavage face 5". Further, a light guide 6 made of a transparent or semitransparent resin is formed on the mount 3 to extend between the rear cleavage face 5" and the monitoring photodiode 4, so that the monitor laser beam E' is reliably received by the monitoring photodiode 4.

The first lead 2 integral with the support plate 1 is flanked by second and third leads 7, 8 which are electrically separate from the first lead 2. Though not illustrated in FIGS. 1-3, the respective leads 2, 7, 8 are electrically connected to their associated components (including the photodiode 4 and the laser chip 5) by wires.

The support plate 1 has an upright mounting segment 10 which provides a flat positioning face 11 for attachment to a transparent plate 12 made of glass for example. The mounting segment 10 has an opening 9 for allowing passage of the output laser beam E. The positioning face 11 of the upright mounting segment 10 is substantially parallel to the front cleavage face 5' of the laser chip 5. The transparent plate 12 may be attached to the positioning face 11 by means of adhesive or solder (specially designed for attachment to glass).

The laser chip 5 together with the support plate 1 and the mount 3 is enclosed in a buffer member 13 made of a relatively soft transparent resin such as silicone resin. Further, the buffer member 13 is enclosed in a molded member 14 made of a relatively hard resin such as epoxy resin.

With the arrangement described above, the transparent plate 12 is held attached to the flat positioning face 11 of the upright mounting segment 10 prior to forming the respective resinous bodies 13, 14. Thus, the accurate positional relation and parallelism between the transparent plate 12 and the front cleavage face 5' of the laser chip 5 can be strictly realized in comparison with the prior art arrangement wherein a transparent plate is attached only to a molded body.

Further, the buffer member 13, which is relatively soft, functions to compensate for difference in thermal expansion between the mount 3, the laser chip 5 and the hard resinous member 14 during operation of the laser device, thereby protecting the laser chip 5 which is mechanically sensitive. If desired, the buffer member 13 may be omitted, provided that the molded member 14 is made of a transparent resin.

The laser device having the above structure may be preferably manufactured in the following way.

Figure 4:
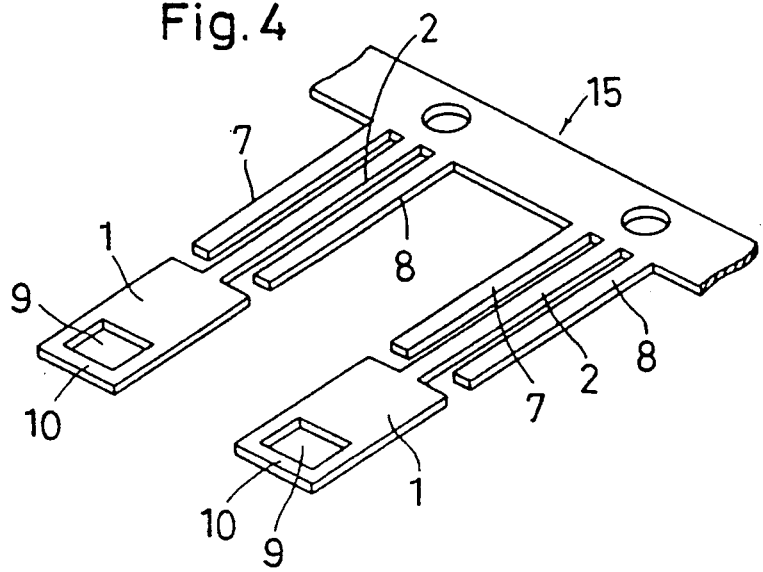
FIGS. 4 through 8 are perspective views illustrating successive method steps for making the same laser device.

First, as shown in FIG. 4, a metallic leadframe 15 is prepared which has groups of first-third leads 2, 7, 8 arranged at predetermined pitch. The central one 2 of the leads in each group is integral with a support plate 1 which has a front end portion 10 (which later provides an upright mounting segment) formed with an opening 9.

Figure 5:
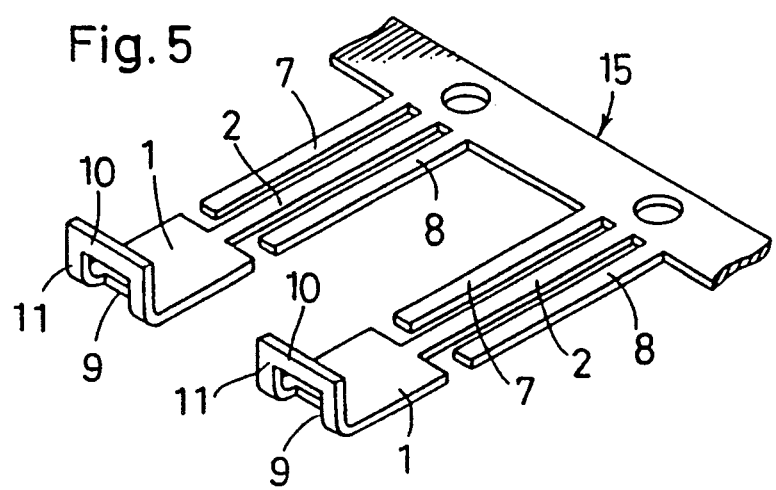

Then, the leadframe 15 is transferred longitudinally thereof. During such transfer, the front end portion 10 of the support plate 1 is bent upright, as shown in FIG. 5.

Figure 6:
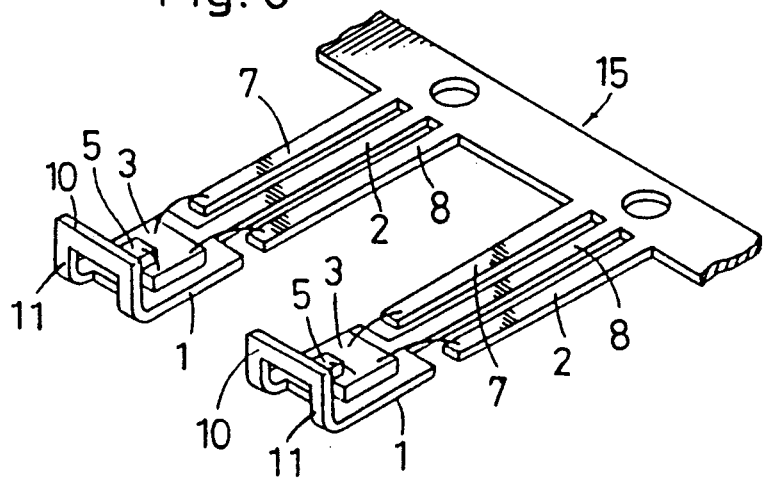

Then, a mount 3 is attached on the support plate 1, and a semiconductor laser chip 5 is attached on the mount 3, as shown in FIG. 6. Thereafter, suitable wire bonding is performed to establish electrical connection, as also shown FIG. 6. In this process step, the upright front end portion or mounting segment 10 of the support plate 1 may be adjusted to become strictly parallel to the front cleavage face 5' (see FIG. 1) of the laser chip 5.

Figure 7:
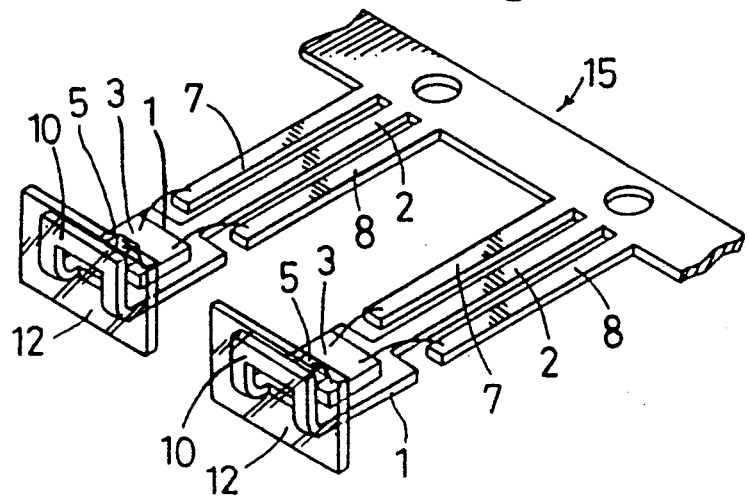

Then, a transparent plate 12 is attached to the flat positioning face 11 of the upright mounting segment 10, as shown in FIG. 7. Thereafter, a light guide 6 (see FIG. 1) is formed on the mount 3 by depositing a transparent resin on the mount 3. Obviously, formation of the light guide 6 may be performed before attachment of the transparent plate 12.

Figure 8:
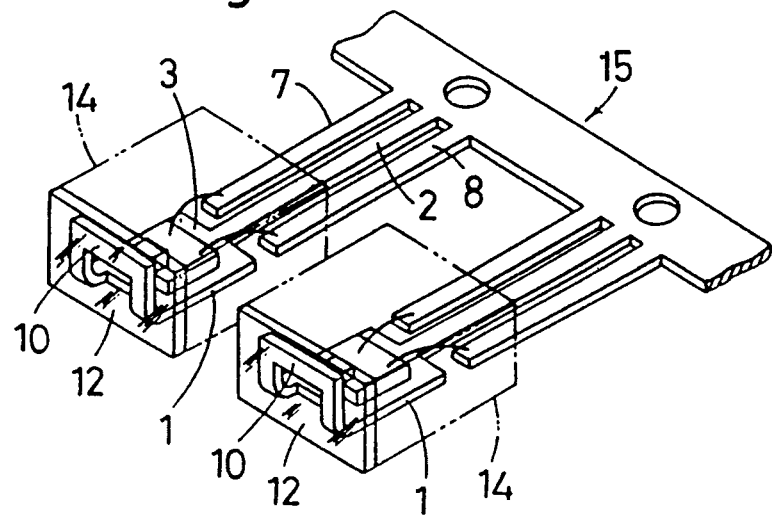

Then, a buffer member 13 is first formed by depositing an amount of relatively soft transparent resin. Thereafter, each group of three leads 2, 7, 8 is placed in a mold (namely, interposed between a pair of mold members), and fluid resin is injected into the mold under pressure. As a result, a laser device enclosed in a molded member 14 is obtained, as shown in FIG. 8. A final product is obtained by cutting the respective leads 2, 7, 8 off the leadframe 15.

In the illustrated embodiment, the transparent plate 12 is attached to the positioning face 11 of the upright mounting segment 10 before forming the buffer member 13 and the molded member 14. However, these resinous members 13, 14 may be formed first as long as the positioning face 11 of the mounting segment 10 is exposed for direct attachment to the transparent plate 12.

EMBODIMENT 2

Figure 9:
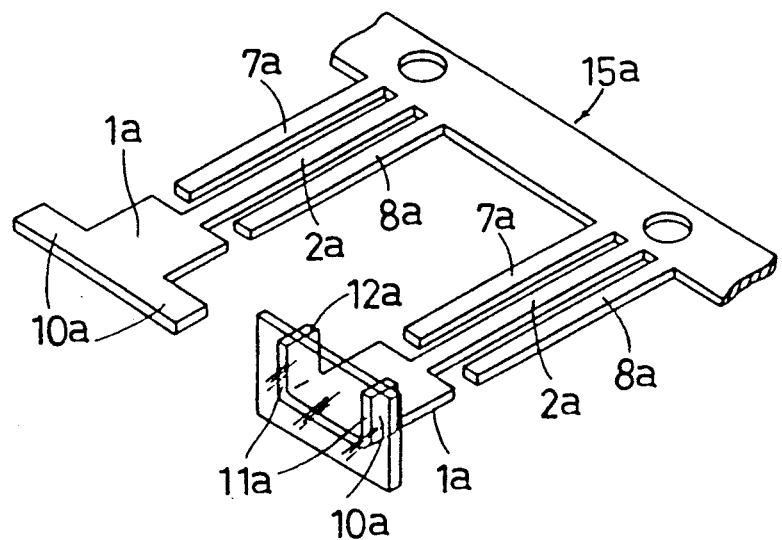
FIG. 9 is a perspective view showing an important method step for making a mold-type semiconductor laser device according to a second embodiment of the present invention.

FIG. 9 shows a modified leadframe 15a used for making a mold-type semiconductor laser device according to a second embodiment of the present invention.

As shown, the leadframe 15a has groups of first-third leads 2a, 7a, 8a arranged at predetermined pitch. The central one 2a of the leads in each group is integral with a support plate 1a which has a pair of side mounting projections 10a.

In manufacture, each side mounting projection 10a of the support plate la is bent upright to provide a positioning face 11a for direct attachment to a transparent plate 12a. Obviously, the positioning face 11a establishes accurate positional relation between the transparent plate 12a and the front cleavage face of a laser chip (not shown).

The second embodiment is otherwise similar to the first embodiment illustrated in FIGS. 1-3.

EMBODIMENT 3

Figure 10:
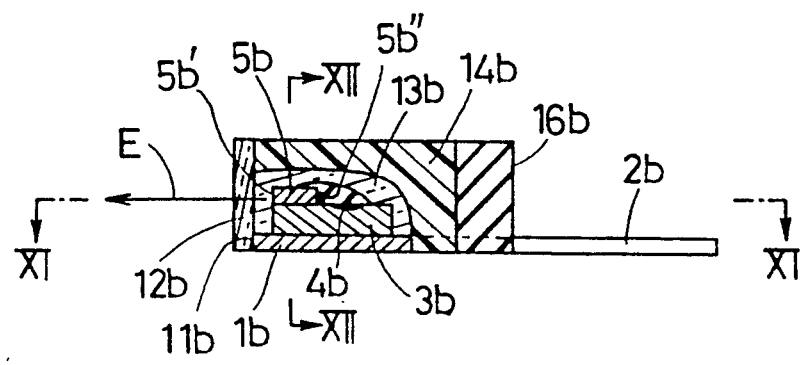
FIG. 10 is a sectional side view showing a mold-type semiconductor laser device according to a third embodiment of the present invention.

FIGS. 10-12 represent a mold-type semiconductor laser device according to a third embodiment of the present invention. Similarly to the first embodiment, the laser device of the third embodiment comprises a thin metallic support plate 1b integral with a first lead 2b. A mount 3b, which itself is provided with a monitoring photodiode 4b, is attached on the support plate 1b.

A semiconductor laser chip 5b is attached on the mount 1b. The laser chip 5b is arranged in a lying posture so that it emits an output laser beam E from its front cleavage face 5b' in parallel to the support plate 1b while also emitting a monitor laser beam E' from its rear cleavage face 5b''. Further, a light guide 6b made of a transparent or semitransparent resin is formed on the mount 3b to extend between the rear cleavage face 5b'' and the monitoring photodiode 4b, so that the monitor laser beam E' is reliably received by the monitoring photodiode 4b.

The first lead 2b integral with the support plate 1b is flanked by second and third leads 7b, 8b which are electrically separate from the first lead 2b. The laser chip 5b together with the support plate 1b and the mount 3b is covered by a buffer member 13b made of a relatively soft transparent resin such as silicone resin. Further, the buffer member 13b is covered by an inner molded member 14b made of a relatively hard resin such as epoxy resin.

Despite the presence of the inner molded member 14b, the lower surface of the support plate 1b remains exposed to the exterior. Such an arrangement is preferred because the support plate 1b can additionally serve to effectively dissipate heat during laser beam emission.

Unlike the first embodiment of FIGS. 1-3, the support plate 1b has no upright mounting segment. Instead, the support plate 1b has a front edge face 11b (see FIG. 10) for direct attachment to a transparent plate 12b made of glass for example. Thus, the front edge face 11b of the support plate 1b itself works as a positioning face which is substantially parallel to the front cleavage face 5b' of the laser chip 5b. The transparent plate 12b may be attached to the positioning edge face 11b of the support plate 1b by adhesive or solder (specially designed for attachment to glass).

Further, according to the third embodiment, the inner molded member 14b is surrounded by an outer molded member 16b which is angularly U-shaped in plan view (see FIG. 11) and made of a relatively hard resin such as epoxy resin. The outer molded member 16b may be made by transfer molding before forming the inner molded member 14b.

The laser device of the third embodiment may be preferably manufactured in the following way.

First, as shown in FIG. 13, a metallic leadframe 15b is prepared which has groups of first-third leads 2b, 7b, 8b arranged at predetermined pitch. The central one 2b of the leads in each group is integral with a support plate 1b which has a positioning edge face 11b.

Then, the leadframe 15b is transferred longitudinally thereof. During such transfer, an outer molded member 16b is formed by transfer molding, as shown in FIG. 14. In the process step of transfer molding, care must be taken to ensure that the lower surface of the support plate 1b remains exposed even after formation of the outer molded member 16b. Otherwise, the support plate 1b cannot serve to provide intended heat dissipation at the time of laser beam emission.

Figure 15:
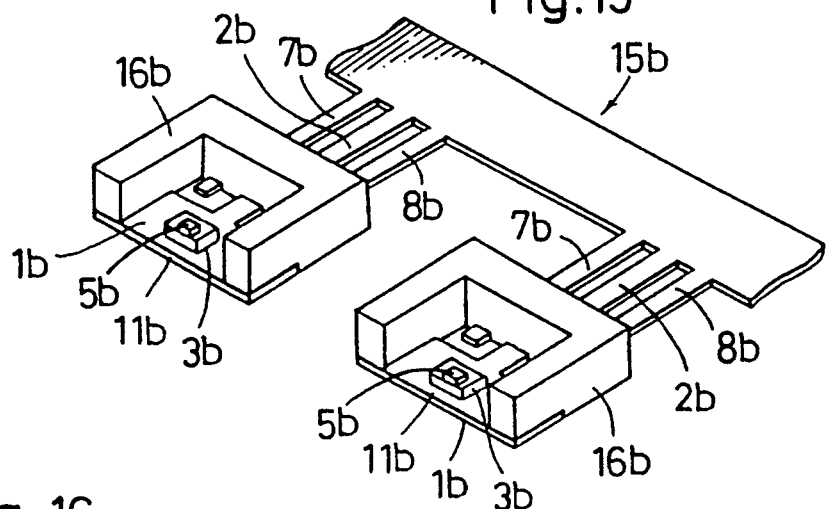

Then, a mount 3b is attached on the support plate 1b, and a semiconductor laser chip 5b is attached on the mount 3b, as shown in FIG. 15. Thereafter, suitable wire bonding is performed to establish electrical connection.

Figure 16:
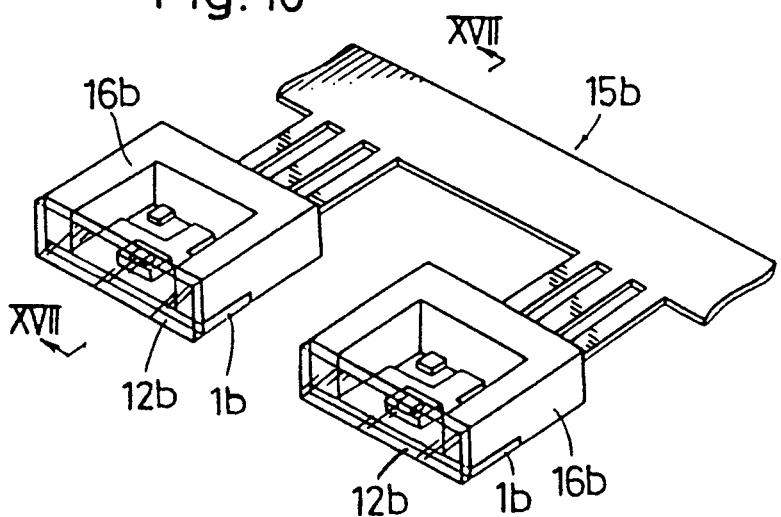

Then, a transparent plate 12b is attached to the positioning edge face 11b of the support plate 1b and the front faces of the outer molded member 16b, as shown in FIG. 16.

Figure 17:
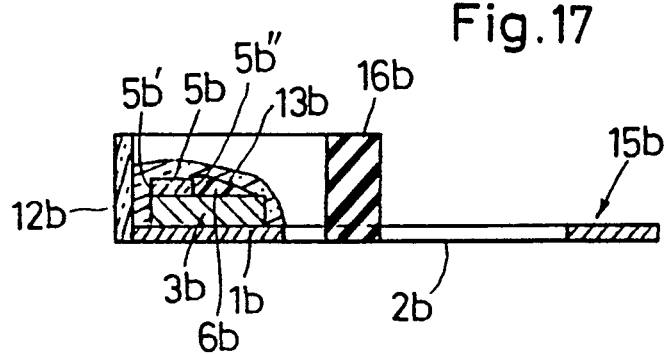
FIG. 17 is a sectional view taken along lines XVII-—XVII in FIG. 16.

Then, a light guide 6b is formed on the mount 3b by depositing a transparent resin on the mount 3b, and upon curing of the light guide 6b, a buffer member 13b is formed by depositing an amount of relatively soft transparent resin, as shown in FIG. 17. Thereafter, an inner molded member 14b is formed by pouring an amount of fluid resin into the cavity defined by the transparent plate 12b and the outer molded member 16b. A final product is obtained by cutting the respective leads 2b, 7b, 8b off the leadframe 15b.

According to the third embodiment described above, the outer molded member 16b, which itself is formed by transfer molding (wherein fluid resin is injected under high pressure), serves as a frame or mold for forming the inner molded member 14b. Thus, the inner molded member 14b can be formed simply by pouring fluid resin without applying pressure. As a result, the laser chip 5b together with the bonding wires (not shown) is prevented from being adversely affected by the high pressure applied for performing transfer molding.

In the third embodiment described above, the front edge face 11b of the support plate 1b itself serves as a positioning face. However, the support plate may be modified to have an upright mounting segment which provides a flat positioning face for attachment to the transparent plate 12b in the same manner as in the first embodiment (FIGS. 1-3). Further, the buffer member 13b may be omitted if so desired.

EMBODIMENT 4

Figure 18:
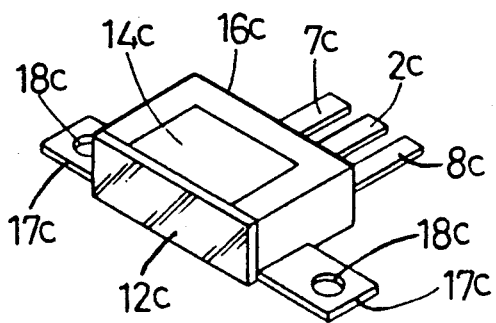
FIG. 18 is a perspective view showing a mold-type semiconductor laser device according to a fourth embodiment of the present invention.

FIG. 18 shows a mold-type semiconductor laser device according to a fourth embodiment of the present invention.

The laser device of the fourth embodiment is similar to that of the third embodiment (FIGS. 10-12) but differs therefrom only in one point. Specifically, the laser device utilizes a support plate (not visible in FIG. 18) which has a pair of lateral extensions 17c each formed with a mounting bore 18c. These lateral extensions 17c are used for conveniently bolting the laser device to a suitable part of an apparatus which incorporates the laser device.

EMBODIMENT 5

FIGS. 19-22 illustrate successive steps of a method for making a mold-type semiconductor laser device according to a fifth embodiment of the present invention.

Figure 19:
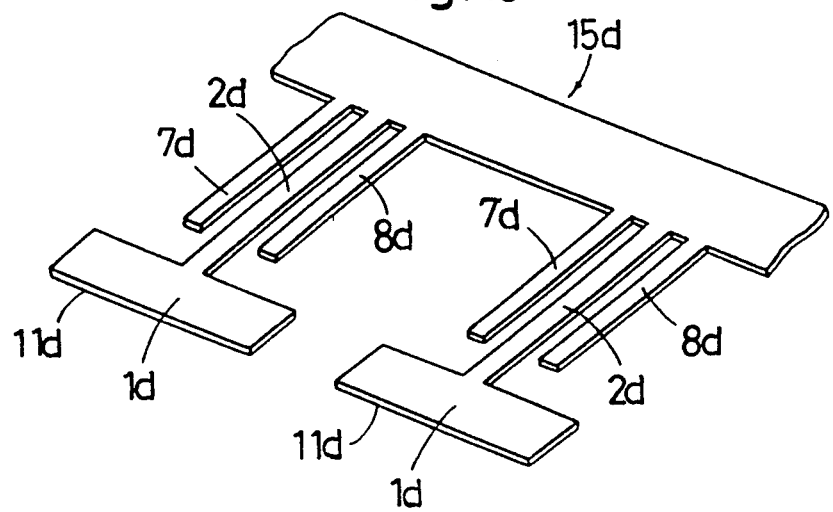
FIGS. 19 to 21 are perspective views showing successive method steps for making a mold-type semiconductor laser device according to a fifth embodiment of the present invention.

In the method of the fifth embodiment, a metallic leadframe 15d is first prepared which has groups of first-third leads 2d, 7d, 8d arranged at predetermined pitch, as shown in FIG. 19. The central one 2d (first lead) of the leads in each group is integral with a support plate 1d which has a positioning edge face 11d. It should be appreciated that the leadframe 15d itself of this embodiment is substantially identical to that of the fourth embodiment.

Figure 20:
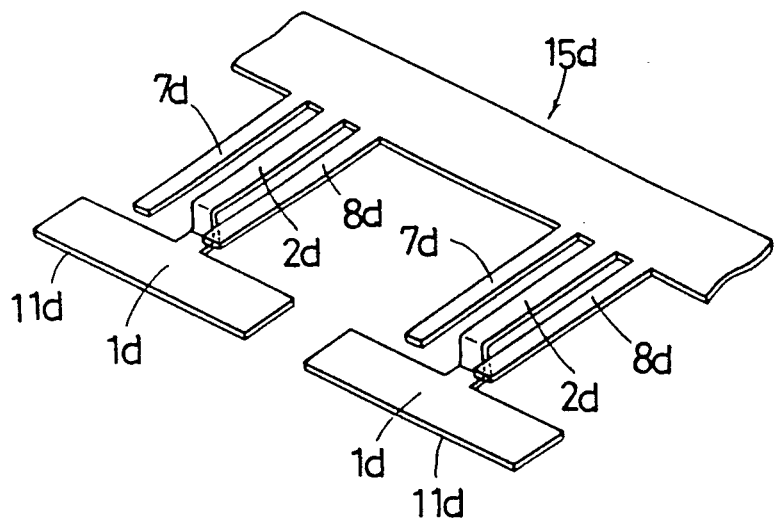

Then, the leadframe 15d is transferred longitudinally thereof. During such transfer, the first lead 2d is bent perpendicularly downward near the support plate 1d, as shown in FIG. 20. As a result, the support plate 1d is positioned slightly lower than the respective leads 2d, 7d, 8d.

Figure 21:
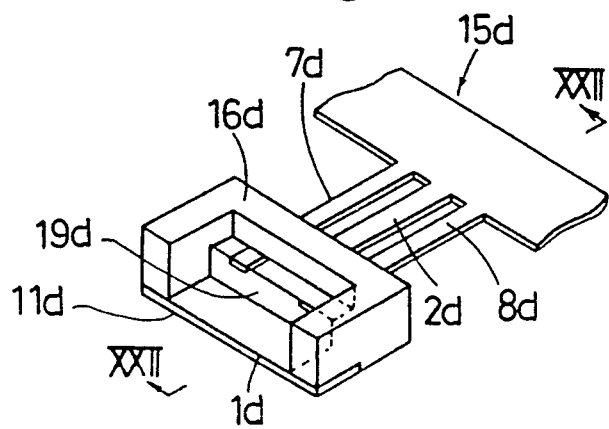

Then, an outer molded member 16d is formed by transfer molding, as shown in FIG. 21. At this time, the outer molded member 16d may be made to have a closure step portion 19d.

Figure 22:
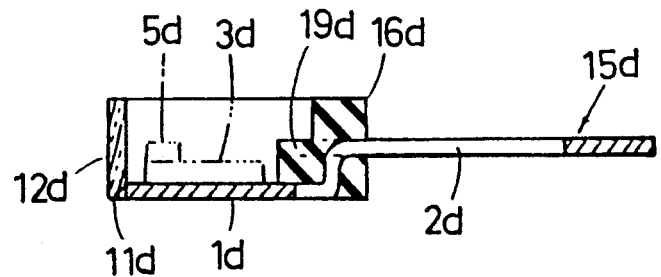
FIG. 22 is a sectional view taken along lines XXII-—XXII in FIG. 21.
Figure 23:
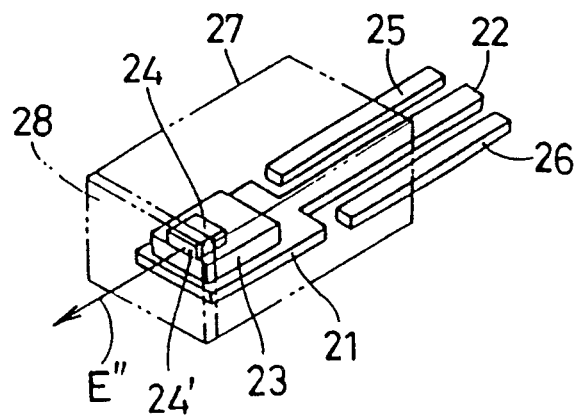
FIG. 23 is a perspective view showing a prior art mold-type semiconductor laser device.
Figure 24:
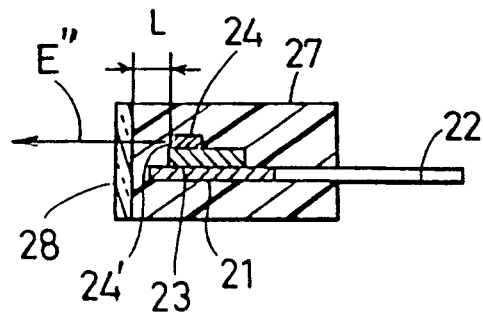
FIG. 24 is a sectional side view showing the same prior art laser device.

Then, a mount 3d is attached on the support plate 1d, and a semiconductor laser chip 5d is mounted on the mount 3d, as shown in FIG. 22. Thereafter, suitable wire bonding is performed to establish electrical connection, and a transparent plate 12d is attached to the positioning edge face 11d of the support plate 1d and the front faces of the outer molded member.

The subsequent process steps of the fifth embodiment are substantially identical to those of the fourth embodiment.

According to the fifth embodiment, the step portion 19d of the outer molded member 16d provides a complete bottom closure in combination with the support plate 1d, thereby making it unnecessary to use a separate bottom closure at the time of pouring fluid resin for forming an inner molded member (not shown). Further, the step portion 19d provides improved fixation of the respective leads 2d, 7d, 8d.

The present invention being thus described, it is obvious that the same may be varied in many ways. Such variations are not to be regarded as a departure from the spirit and scope of the invention, and all such modifications as would be obvious to those skilled in the art are intended to be included within the scope of the following claims.

We claim:

1. A mold-type semiconductor laser device comprising:
    a metallic support plate;
    a semiconductor laser chip carried by the support plate, the laser chip having a front cleavage face for emitting an output laser beam;
    a resinous molded body for sealing the laser chip; and
    a transparent plate arranged in opposed relation to the front cleavage face of the laser chip;
    wherein the support plate has a positioning face which is substantially parallel to the front cleavage face of the laser chip and comes into direct contact with the transparent plate; and
    wherein the support plate is integrally formed with an upright mounting segment which has an opening in front of the front cleavage face of the laser chip, said positioning face being provided by the mounting segment.

2. The laser device according to claim 1, wherein the laser chip is enclosed in a buffer member which is made of a relatively soft transparent resin, the buffer member being surrounded by the resinous molded body.

3. The laser device according to claim 1, wherein the support plate is integral with a first lead which is flanked by at least one additional lead, the respective leads being partially embedded in the molded body.

4. A mold-type semiconductor laser device comprising:
    a metallic support plate;
    a semiconductor laser chip carried by the support plate, the laser chip having a front cleavage face for emitting an output laser beam;
    a resinous molded body for sealing the laser chip; and
    a transparent plate arranged in opposed relation to the front cleavage face of the laser chip;
    wherein the support plate has a positioning face which is substantially parallel to the front cleavage face of the laser chip and comes into direct contact with the transparent plate; and
    wherein the support plate is integrally formed with an upright side mounting projections forwardly on both sides of the front cleavage face of the laser chip, said positioning face being provided by each of the side mounting projections.

5. A mold-type semiconductor laser device comprising:
    a metallic support plate;
    a semiconductor laser chip carried by the support plate, the laser chip having a front cleavage face for emitting an output laser beam;
    a resinous molded body for sealing the laser chip; and
    a transparent plate arranged in opposed relation to the front cleavage face of the laser chip;
    wherein the support plate has a positioning face which is substantially parallel to the front cleavage face of the laser chip and comes into direct contact with the transparent plate; and
    wherein the resinous molded body comprises a frame-like outer molded member surrounding the laser chip but spaced therefrom, the outer molded member opening in a direction away from the support plate, the resinous molded body further comprising an inner molded member formed in the outer molded member for sealing the laser chip.

6. The laser device according to claim 5, wherein the frame-like outer molded member is generally U-shaped.

7. The laser device according to claim 5, wherein the outer molded member has a bottom-closing step portion.

8. The laser device according to claim 5, wherein the laser chip is enclosed in a buffer member which is made of a relatively soft transparent resin, the buffer member being surrounded by the resinous molded body.

9. The laser device according to claim 5, wherein the support plate has an exposed surface on a side thereof away from the laser chip.

10. The laser device according to claim 5, wherein the support plate has a pair of lateral extensions projecting from the molded body, each of the lateral extensions being formed with a mounting bore.

11. The laser device according to claim 5, wherein the support plate is integral with a first lead which is flanked by at least one additional lead, the respective leads being partially embedded in the molded body.

12. The laser device according to claim 11, wherein the first lead is bent near the support plate so that the support plate is located in a plane which is displaced from another plane containing the respective leads.

* * * * *